(12) United States Patent
Poortinga et al.

(10) Patent No.: US 8,913,120 B2
(45) Date of Patent: Dec. 16, 2014

(54) METHOD FOR EMULATION OF A PHOTOLITHOGRAPHIC PROCESS AND MASK INSPECTION MICROSCOPE FOR PERFORMING THE METHOD

(75) Inventors: Eric Poortinga, Round Rock, TX (US); Thomas Scherübl, Jena (DE); Rigo Richter, Zeulenroda-Triebes (DE); Arne Seyfarth, Jena (DE)

(73) Assignee: Carl Zeiss SMS GmbH, Jena (DE)

( * ) Notice: Subject to any disclaimer, the term of this patent is extended or adjusted under 35 U.S.C. 154(b) by 515 days.

(21) Appl. No.: 12/862,057

(22) Filed: Aug. 24, 2010

(65) Prior Publication Data

US 2011/0090329 A1   Apr. 21, 2011

Related U.S. Application Data

(60) Provisional application No. 61/236,195, filed on Aug. 24, 2009.

(30) Foreign Application Priority Data

Aug. 24, 2009   (DE) .......................... 10 2009 038 588

(51) Int. Cl.
| | | |
|---|---|---|
| *G06K 9/00* | (2006.01) | |
| *H04N 7/18* | (2006.01) | |
| *G03F 1/00* | (2012.01) | |
| *G03F 7/20* | (2006.01) | |
| *G03F 1/84* | (2012.01) | |

(52) U.S. Cl.
CPC ............ *G03F 7/70466* (2013.01); *G03F 1/144* (2013.01); *G03F 1/84* (2013.01); *G03F 7/705* (2013.01); *G03F 7/70666* (2013.01)
USPC .......................................................... 348/79

(58) Field of Classification Search
None
See application file for complete search history.

(56) References Cited

U.S. PATENT DOCUMENTS

| | | | | |
|---|---|---|---|---|
| 2002/0036711 | A1* | 3/2002 | Sugimoto ...................... | 348/573 |
| 2002/0196418 | A1* | 12/2002 | Hagiwara et al. ............... | 355/67 |
| 2003/0026471 | A1* | 2/2003 | Adel et al. ...................... | 382/144 |
| 2004/0013229 | A1* | 1/2004 | Alving et al. ................... | 378/49 |
| 2004/0038455 | A1* | 2/2004 | Seligson et al. ............... | 438/122 |

(Continued)

FOREIGN PATENT DOCUMENTS

| | | | | |
|---|---|---|---|---|
| DE | 103 32 059 | 1/2005 | ............. | G01B 11/24 |
| DE | 103 60 536 | 5/2005 | ............. | G01M 11/00 |

(Continued)

*Primary Examiner* — Sath V Perungavoor
*Assistant Examiner* — Kate Luo
(74) *Attorney, Agent, or Firm* — Fish & Richardson P.C.

(57) ABSTRACT

In mask inspection, the defects that are of interest are primarily those that will also show up on wafer exposure. The aerial images generated in the resist and by emulation should be as identical as possible. This also applies to methods in which an overall structure that is divided into at least two substructures on at least two masks. A system and a method are provided for emulating a photolithographic process for generating on a wafer an overall structure that is divided into at least two substructures on at least two masks. The method includes generating aerial images of the at least two substructures, at least one of the aerial images being captured with a mask inspection microscope; correcting, by using a processing unit, errors in the at least one aerial image captured with a mask inspection microscope; and overlaying the aerial images of the at least two substructures to form an overall aerial image with the overall structure.

55 Claims, 5 Drawing Sheets

(56) References Cited

U.S. PATENT DOCUMENTS

| | | | |
|---|---|---|---|
| 2005/0048379 A1* | 3/2005 | Koehle et al. | 430/5 |
| 2006/0007541 A1 | 1/2006 | Totzeck et al. | |
| 2006/0012873 A1 | 1/2006 | Totzeck et al. | |
| 2006/0048090 A1* | 3/2006 | Feldman | 716/21 |
| 2006/0114453 A1 | 6/2006 | Goldenshtein et al. | |
| 2006/0147815 A1* | 7/2006 | Melvin | 430/5 |
| 2006/0269117 A1 | 11/2006 | Seitz et al. | |
| 2007/0177132 A1* | 8/2007 | Smith | 356/124 |
| 2007/0230770 A1* | 10/2007 | Kulkarni et al. | 382/149 |
| 2008/0152212 A1 | 6/2008 | Feldman | |
| 2008/0204735 A1 | 8/2008 | Heiden | |
| 2008/0212060 A1 | 9/2008 | Greif-Wuestenbecker et al. | |
| 2008/0304056 A1* | 12/2008 | Alles et al. | 356/237.5 |
| 2009/0016595 A1* | 1/2009 | Peterson et al. | 382/144 |
| 2009/0100391 A1* | 4/2009 | Van Der Heijden et al. | 716/5 |
| 2009/0214962 A1* | 8/2009 | Mishima | 430/30 |
| 2010/0157046 A1 | 6/2010 | Kienzle et al. | |

FOREIGN PATENT DOCUMENTS

| | | | | |
|---|---|---|---|---|
| DE | 10 2004 033 602 | 2/2006 | | G01M 11/00 |
| DE | 10 2004 033 603 | 2/2006 | | G01M 11/00 |
| DE | 10 2005 042 496 | 3/2007 | | G02B 27/58 |
| DE | 10 2007 000 981 | 8/2008 | | G01B 11/24 |
| DE | 10 2007 033 243 | 1/2009 | | G03F 7/20 |

* cited by examiner

METHOD FOR EMULATION OF A PHOTOLITHOGRAPHIC PROCESS AND MASK INSPECTION MICROSCOPE FOR PERFORMING THE METHOD

CROSS REFERENCE TO RELATED APPLICATIONS

This application claims priority to U.S. Provisional Application 61/236,195, filed on Aug. 24, 2009, and German Patent Application DE 10 2009 038 558.4, filed on Aug. 24, 2009, both incorporated herein by reference in their entirety.

TECHNICAL FIELD

This document generally relates to emulation of a photolithographic process for generating on a wafer an overall structure that is divided into at least two substructures on at least two masks.

BACKGROUND

In lithography for the manufacture of semiconductor components, scanners or steppers are used to project the structures of reticles, also known synonymously as masks, onto wafers coated with a light-sensitive layer, the resist. To produce ever-smaller structures on the wafer, it is necessary to increase the resolution with which the wafer is exposed. For example, in scanners for wafer exposure, the illumination is optimized according to the structures of the particular reticle to be imaged. Various illumination settings are used, which describe the intensity distribution of the illumination in a pupil plane of the illumination beam path of the scanner. Other methods of increasing the resolution include multiple illumination, for example, dual illumination, also commonly known as "double exposure," and multiple structuring of the masks, for example, dual structuring, also commonly known as "double patterning."

In these methods, the overall layer structure to be produced on the wafer is divided into two or more substructures formed on a set of different masks. In double exposure, a resist layer of the wafer is exposed with each substructure individually in succession. This is followed by the development of the resist and the etching of the wafer. In double patterning, after each substructure is exposed, the resist is developed, and, where appropriate, the wafer is etched and coated with new resist before the next substructure is exposed. Variants of double patterning are also known in which, for example, the resist is cured after exposure and another resist layer is then applied for further exposure.

An increase in resolution can be achieved in both methods by adjusting the illumination settings to the particular substructure. For example, an overall structure is divided into two substructures on two masks in such a way that each of the substructures contains grid structures composed of lines and spaces but rotated 90° from one substructure to the next. The aerial images of the substructures can then be captured using, as pupil filters, dipoles that are likewise rotated 90° from one substructure to the next. The dose and polarization of the exposure light are likewise adjusted to the particular substructure. To increase resolution in the case of line-and-space grid structures of one direction, the resolution limit can be increased by double patterning. Here, in the so-called double line process, every other line (or every other space, in the double trench process) is assigned to a different substructure. This has the effect of minimizing the achievable minimum spacing between lines (the pitch).

In the case of mask inspection microscopes, the structure of a reticle is projected onto a light-sensitive, spatially resolved image capture device, for example, a charge coupled device (CCD) chip. The image data are read by a computer and the data structure obtained is stored as a graphics file in the random access memory. The structure is magnified, for example by a factor of 450, so that any defects in the structure can be identified more precisely. Since the defects that are of interest in mask inspection are primarily those that will also show up on wafer exposure, the aerial images generated in the resist and on the detector should be as identical as possible, apart from the difference in imaging scale. To achieve equivalent image generation, the wavelength used during mask inspection, the illumination, and, at the object end, the numerical aperture are adapted to the scanner being used.

In double exposure and double patterning, the captured images of the substructures are overlaid in order to visualize the overall structure. A method of this kind is known from Patent Application DE10360536.

SUMMARY

In general, in one aspect, a method and a mask inspection microscope for generating overall images with increased accuracy are provided. A photolithographic process for generating on a wafer an overall structure that is divided into at least two substructures on at least two masks is emulated. Aerial images of the at least two substructures are generated, and at least one of the aerial images is captured with a mask inspection microscope. A processing unit corrects errors in the at least one aerial image captured with the mask inspection microscope. The aerial images of the at least two substructures are overlaid to form an overall aerial image with the overall structure.

Implementations can include one or more of the following features. The aerial images of the substructures, having been measured with a mask inspection microscope, can be processed further to emulate the overall structure that is to be generated on the wafer. The emulation can take place at various levels. For example, the aerial image of the overall structure that will be created in the resist, the conditions after the development of the resist, or the conditions after the etching of the wafer can be simulated.

The aerial images generated can be in the form of two-dimensional matrices of intensity values, for example, as data structures in the random access memory of the processing unit, such as, for example, a personal computer, or they can be stored as files in non-volatile memories, such as, for example, a hard drive of the processing unit.

Errors (for example, aberrations or position errors) that occur in the individual measurements of the substructures can be amplified or attenuated in the generated overall image, thereby limiting the desired prediction of the overall structure generated in the resist by a set of masks. The accuracy of the emulation can be increased by correcting these errors. This may have the following advantage. Errors caused by the mask inspection microscope during the capture of the aerial images may produce little or no falsification of the result during the analysis of the overall structure. In some implementations, there is no need for correction using the more painstaking, hardware-based method of modifying the mask inspection microscope. The measurement results may have accuracy that cannot be attained by hardware manipulation.

A target position on at least one of the at least two masks can be specified for the capture of the at least one aerial image, a deviation of the target position from an actual position can be determined by overlaying the captured aerial image with the simulated reference image, and the actual position can be corrected so that it matches the target position. Deviations of the actual position from the target position can be caused by, for example, inaccuracy in the positioning of the mask by using the stage or by variable drift of the imaging optic of the mask inspection microscope, for example, due to temperature fluctuations. Position errors during the measurement of the substructures can lead to incorrect display of the overall structure, showing a purported overlay error whose cause lies in the emulation. If, in addition to the capture of aerial images in the best focal plane, aerial images of spaced-apart, parallel planes are captured (a so-called focus stack), the correction of the aerial images can be applied to all the aerial images in a focus stack. In correcting the target position, the correction value for the best focus plane can be determined and applied to the aerial images of the other planes. By correcting the position errors, the accuracy of the overlay of the substructures can be increased.

Aberrations introduced into the at least one captured aerial image by the mask inspection microscope can be corrected. The aberrations can be, for example, distortions or image area curvatures of the imaging optic of the mask inspection microscope. The errors in the display of the overall structure that have been caused by the emulation can be reduced or minimized.

At least one of the aerial images can be adjusted by simulating aberrations introduced by the scanner. The aberrations can be, for example, distortions or image area curvatures of the imaging optic of the scanner. The adjustments further increase the conformity of the emulated aerial image of the overall structure with the aerial image generated by the scanner.

The at least two aerial images can be adjusted relative to each other by displacement. This may have the advantage that an overlay error can be simulated.

At least a portion of the displacement can correspond to a registration error resulting from the distortion of the substructures. This may have the following advantage. The error in the displacement of structural features which is often known to occur in mask metrology, and which is referred to as a placement error or a registration error, can be included in the emulation.

At least a portion of the displacement can correspond to an overlay error of a scanner. This may have the following advantage. The error of displacement caused by overlaying substructures of different masks, which error is often known from specifications of the scanner used, can be included in the emulation.

A display of intensity values that are greater than an intensity threshold can be carried out as an adjustment of the aerial images. Intensity values that are above the intensity threshold can be displayed in another color or hatching than intensity values that are below the intensity threshold. This may have the following advantage. An expected structure to be generated on the wafer can be represented in simple and fast approximation.

A resist simulation can be performed as an adjustment of the aerial images. This may have the following advantage. An expected structure to be generated in the resist layer on the wafer by double patterning can be represented in good approximation.

A resist simulation can be performed as an adjustment of the overall image. This may have the following advantage. An expected structure to be generated in the resist layer on the wafer by double exposure can be represented in good approximation.

The intensity threshold or an effective dose can be varied in real time to perform the resist simulation. The effective dose here is a measure of the exposure dose of the scanner and is used as a parameter for the resist simulation. Before the overlaying of the aerial images of the at least two substructures, the aerial images can be adjusted according to the ratio of the doses to be used for the masks in the scanner by multiplying all the intensity values of at least one of the aerial images by a factor. When a set of masks is used in the scanner, the dose is adjusted for each mask so that, for example, the desired critical dimension (CD) is obtained on exposure of the wafer. For the simulation, the ratio between the doses specified for each mask can be preset. If two masks are used, the ratio of dose 1 of mask 1 to dose 2 of mask 2 will be, for example, dose 1/dose 2. If the aerial images are in the form of two-dimensional matrices of intensity values, the intensity values are adjusted according to the ratio of the doses by being multiplied by the appropriate factor. This may have the following advantage. The parameters can be adjusted in a rapid manner. This is important because the equivalent parameter in the actual process, the dose from the scanner, is widely variable. This is used to adjust the critical dimension of the structure to the presets.

At least one of the aerial images can be generated by simulation from mask design data. This may have the following advantage. One of the substructures of a mask can be checked in a rapid manner. This reduces or eliminates the need to change masks, which can involve painstaking adjustment of the mask inspection microscope.

The simulation of the at least one aerial image or reference image can be based on the same illumination settings of the mask inspection microscope as the capture of the images. This can have the following advantage. The simulation can correspond to a measured image with higher accuracy.

It is understood that the features described above can be used not only in the described combinations, but also in other combinations or individually, without departing from the scope of the invention.

DETAILED DESCRIPTION

Figure 1:
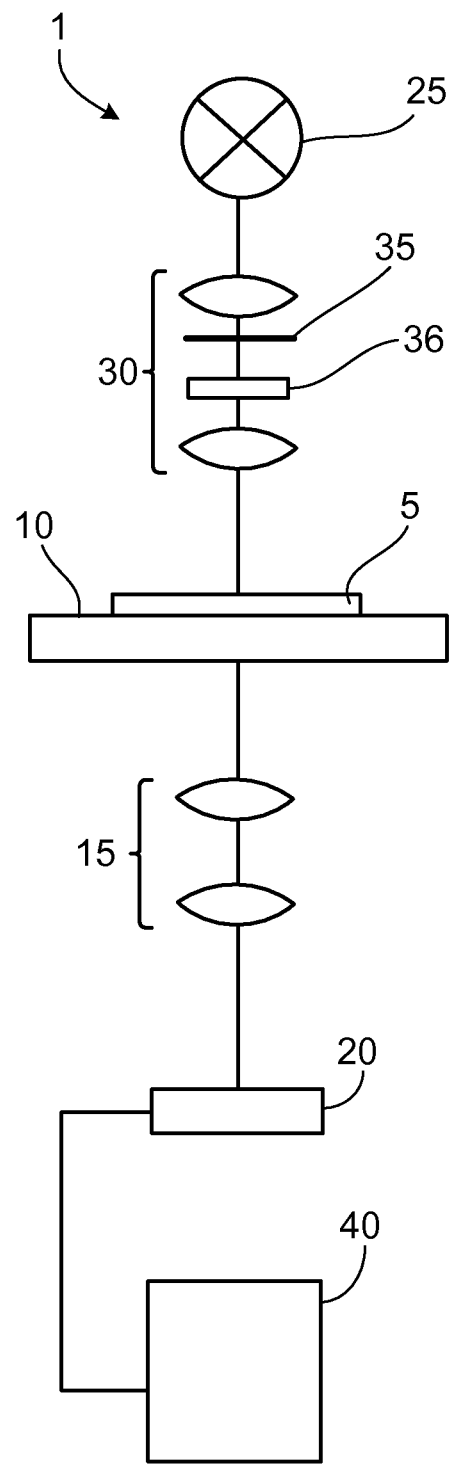
FIG. 1 is a schematic diagram of an example mask inspection microscope.

Referring to FIG. 1, to emulate double exposure or double patterning, aerial images of two substructures, each disposed on a respective mask 5, are captured with a mask inspection microscope 1. The aerial image of one of the substructures can also, alternatively, be generated by simulation. The method will be described below for two substructures on two masks, but it can be performed with any number greater than two of masks and substructures.

The mask inspection microscope 1 has a mask holder 10 (a stage) to support the mask 5 and an image capture device 20, which can be, for example, a charge coupled device (CCD) chip. A light source 25 generates light that passes illumination optics 30 to illuminate the mask 5. Illumination settings can be adjusted using a pupil filter 35 and a polarizer 36. Illumination settings and polarization settings adapted to the structure are used in capturing the aerial images of the substructures.

The mask holder 10 is movably disposed in the horizontal plane, which is denoted the X-Y plane. To effect positioning, a device coordinate system is assigned to the mask holder, such that when given specified device coordinates X and Y, the mask holder 10 can be moved to the corresponding position. A mask coordinate system of the mask 5 to be examined is oriented relative to the device coordinate system using alignment marks. Positions on the mask are unambiguously defined by the mask coordinate system. The positions of the structures are also stated in mask coordinates in the mask design, i.e., the mask design data, which are in the form of files or data structures in which the structures of the mask are specified.

An aerial image of the mask is generated in the plane of the image capture device 20 using imaging optics 15. To achieve focusing, the imaging optics 15 are moved in the direction perpendicular to the X-Y plane, denoted the Z-direction. The aerial image is read by a processing unit 40, which can be, for example, a computer. The aerial image is initially in the form of a data structure residing in the random access memory of the computer. The data structure can be stored as a graphics file on the computer's hard drive.

In some implementations, the data structure or graphics file can include, e.g., a two-dimensional matrix representing pixels. The intensities of the pixels are represented by numeric values from 0 to 255. The intensities are normalized by using reference measurements such that at a completely transparent location on the mask, for example a chromium-free location on a quartz/chromium mask, the intensity is assigned the maximum value of 255 ("clear normalization"), while at a completely opaque location on the mask, for example a completely chromium-coated location on the quartz/chromium mask, the intensity is assigned the minimum value of 0. The image area on the mask is square, with an edge length of 10 µm. The slice of the captured substructure is defined by the image area.

To capture the aerial images, a target position of the structure slices to be captured is specified on the mask or from the mask design. The target position denotes the X- and Y-coordinates of the center of the image area on the mask in the mask coordinate system. The coordinates of the target position are converted into device coordinates, and the position is then navigated to by using the mask holder 10. The target position at which an aerial image is captured is the same for both masks 5. Overlaying the structure slices of the substructures of both masks 5 at the target position yields the corresponding slice of the overall structure.

In addition to capturing aerial images in the best focus plane, it is also possible to capture aerial images of spaced-apart parallel planes, so-called focus stacks. For example, seven evenly spaced-apart planes can be measured: the best focus plane itself, three planes above it and three below. In this way, the critical dimension (CD) or the exposure latitude (EL) can be applied via the focus to display a so-called process window. Unless otherwise specified, the following discussion relates to aerial images of the best focus plane.

Known methods, such as, for example, Kirchhoff simulation or rigorous methods, are used to simulate aerial images from the mask design. Simulators of this kind are also available commercially, such as, for example, the software programs Calibre Workbench (available from Mentor Graphics, Wilsonville, Oreg.), Prolith, or Panoramics. Simulation can be used instead of measurement to generate an aerial image of one of the substructures or to correct the position of the captured aerial images. All the planes of a focus stack can be simulated. The illumination settings and the polarization settings are also included in the simulation of the aerial images.

Known imaging errors of the mask inspection system used to examine the captured aerial images can be corrected. To this end, suitable algorithms that eliminate the aberrations of the mask inspection microscope are applied to the graphics files or data structures of the captured structure slices. This can be performed for all the planes of a focus stack.

To measure an aerial image, the mask 5 is placed on the stage 10 and navigated to the specified target position. It is possible that the actual position reached in this way will not match the target position, due to inaccuracies in the positioning of the stage or aberrations of the imaging optic of the mask inspection microscope.

Figure 2:
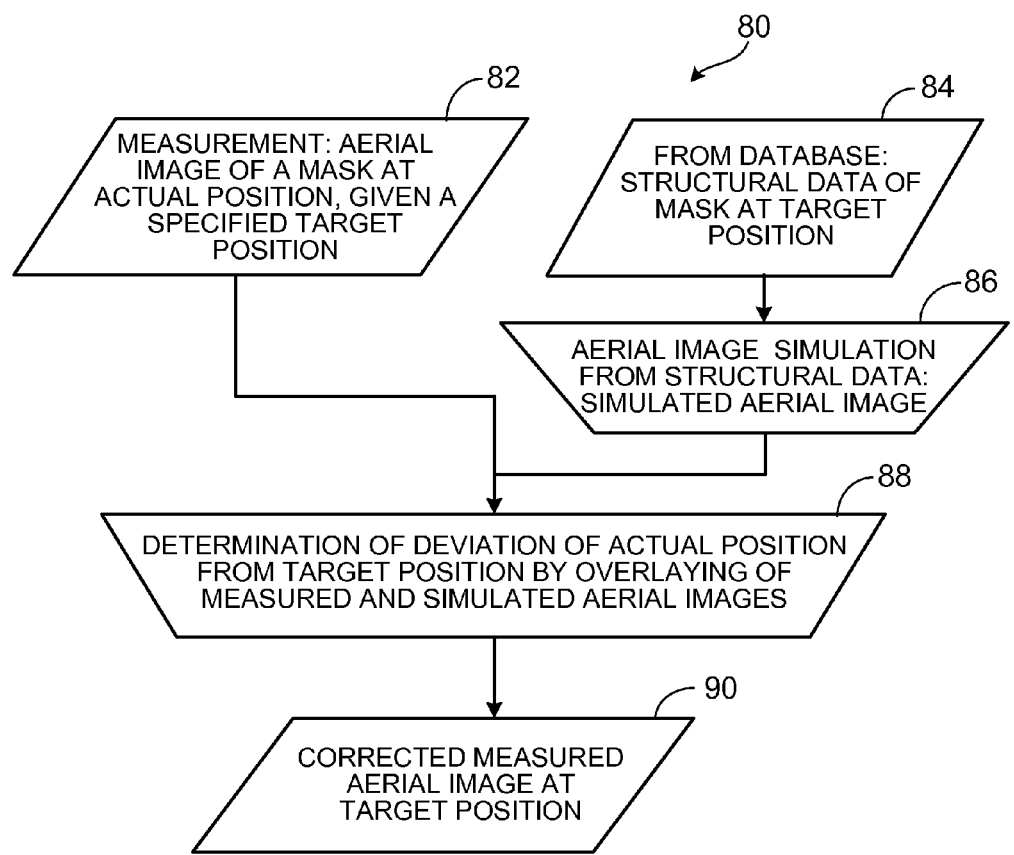
FIG. 2 is a diagram of an example process for correcting the target position of a measured aerial image.

FIG. 2 is a diagram of an example process 80 for correcting the target position of a measured aerial image. For a given specified target position, an aerial image of a mask at an actual position is measured 82. The structural data (e.g., mask design file) of the mask at the target position is retrieved from a database 84. Based on the structural data, an aerial image simulation is performed to generate a simulated aerial image of the mask at the target position 86. To correct the position of the measured aerial image, the measured aerial image is superimposed with the simulated image of the corresponding slice of the substructure of the mask. During this process, the expected aerial image of the mask slice to be measured is simulated with the aid of the mask design file. For each slice to be measured, the aerial image of the mask is aligned with the simulation aerial image by using a correlation algorithm, thus permitting more exact position determination. A deviation of the actual position from the target position of the slice is determined 88. This deviation, referred to as the position error, is stated as the value pair $\Delta X$ and $\Delta Y$. The measured slice is then shifted accordingly, so that the position of the slice corresponds to the specified target position 90. To achieve this, the X- and Y-coordinates of all the pixels in the slice of the mask are corrected by the position errors $\Delta X$ and $\Delta Y$. This correction can be performed for all the aerial images in a focus stack. The correction values determined for the best focus plane can also be applied to all other focal planes.

The correlation algorithm calculates the difference between the aerial image and the simulated image for various displacements for the aerial image, and the displacement resulting in the smallest difference is determined. Using the correlation algorithm, the differences between the intensity values of the mutually overlaid pixels of the two images are calculated pixel by pixel. The sum of the absolute differences between the grayscale values of the individual pixels overlying one another after a particular displacement is determined. The images are displaced pixel by pixel relative to each other until the summed differences reach a minimum. The starting point for the calculation is the position of the aerial image as defined by the target value for the position of the stage and the position of the simulated image in the mask design.

In a further development, the mutual spacing of the images is calculated by cross-correlation. Cross-correlation of the images yields a correlation pattern, whose maximum is determined. The position of this maximum corresponds to the spacing between the images. If the first image appears as matrix A and the second image as matrix B, then:

$$corr = ifft[fft(A) \cdot conj(fft(B))]$$

Here, corr is the cross-correlation, ifft is the inverse Fourier transform, fft is the Fourier transform, and conj is the conjugate. The images are then shifted relative to one another until a minimum spacing between the two images is reached.

To overlay the images, it is possible to specify a deviation from the target positions of the two aerial images of the substructures, as typically occurs in the lithographic process. This error is referred to as the overlay error. The user can specify two value pairs for the overlay error, one for the so-called "registration error," caused by distortions on the mask, and one for the so-called "scanner error," which is caused by displacement between masks and wafers in the scanner. The values relate to the differences between the target positions of the substructures. The X- and Y-values of this error are stated in nm referred to the mask, in the case of the registration error, and in nm referred to the wafer, in the case of the scanner error. In some examples, in being projected from the scanner, the image on the wafer is reduced in size by a factor of four, the X- and Y-values of the wafer error are accordingly converted into values referred to the mask. During the overlaying of the images, the registration error and the converted scanner error are added together, and the sum is then added to the coordinates of the target position of one of the aerial images.

Before the images of the substructures are overlaid, scanner aberrations can be simulated. For this purpose, suitable algorithms that introduce the aberrations of the scanner are applied to the graphics files or data structures of the captured structure slices.

To correct the aberrations of the mask inspection microscope or simulate the aberrations of the scanner, the particular aberrations first have to be known. Methods for determining them are known. Wavefront aberrations of the mask inspection microscope or the scanner are, for example, often provided in the form of Zernike coefficients. These can be used to correct or simulate the aberrations.

The overlaying of the two aerial images of the substructures then proceeds in different ways, depending on whether double exposure (see FIG. 3) or double patterning (see FIG. 4) is to be emulated.

Double Exposure

Figure 3:
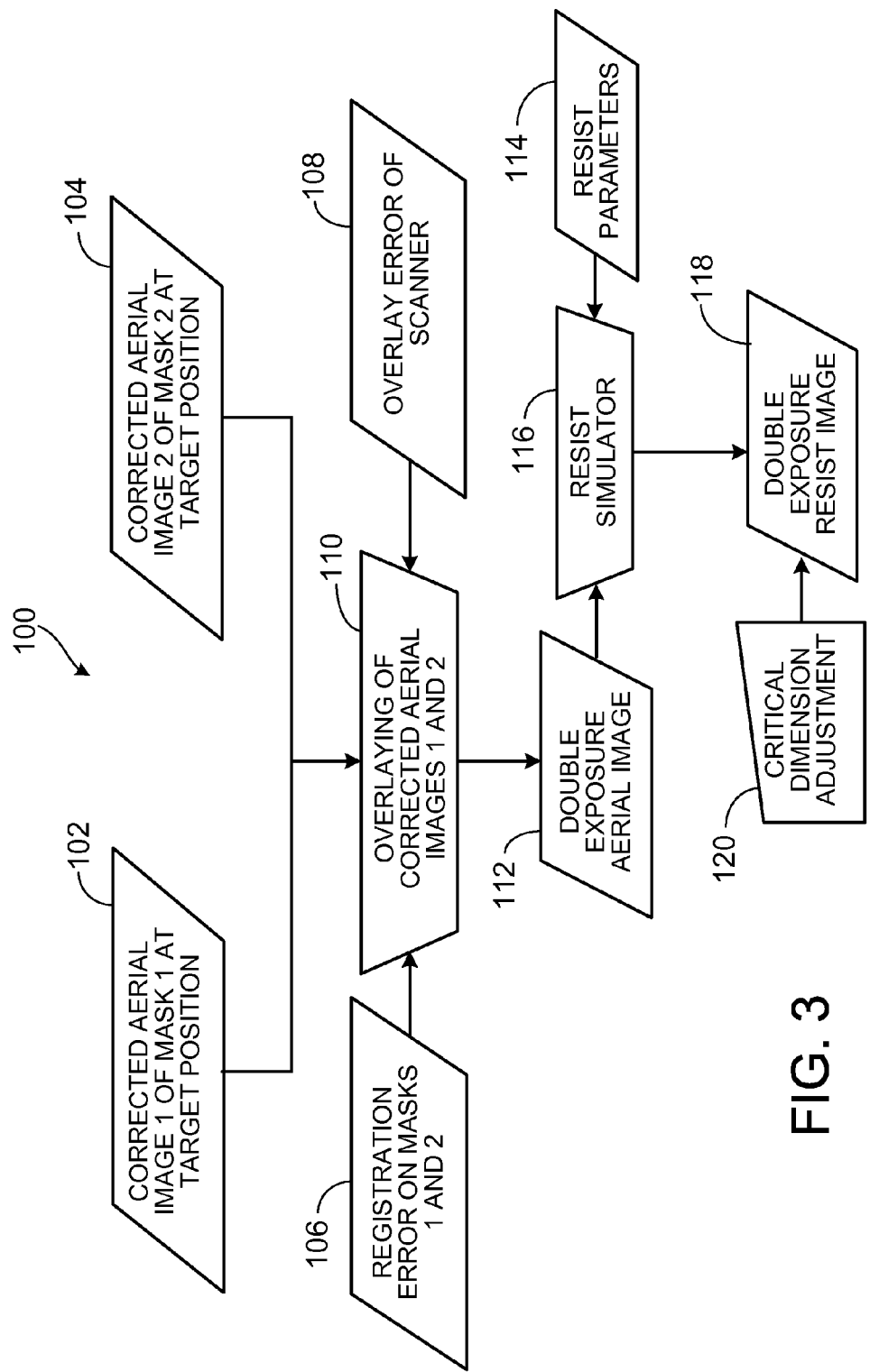
FIG. 3 is a diagram of an example process for emulating double exposure.

FIG. 3 is a diagram of an example process 100 for emulating double exposure. To emulate double exposure, a first corrected aerial image of a first mask at a target position is determined 102, and a second corrected aerial image of a second mask at a target position is determined 104. Registration errors on the first and second masks are determined 106. An overlay error of the scanner is determined 108. The intensity values of the pixels of the first and second corrected aerial images to be mutually overlaid, contained in the graphics files or the data structures, are added together 110, taking into account of the registration errors and the scanner error. The resulting graphics file or data structure now represents the intensity distribution of the overall aerial image that forms on the wafer in the radiation-sensitive layer (the resist) as a result of exposure by the scanner 112.

For the exposure of the wafer in the scanner, a dose is specified for each of the masks. The ratio between the doses of the two masks is taken into account in the simulation. This is done by multiplying the intensity values of one of the graphics files or data structures by a corresponding factor. If the ratio of the dose of mask 1 to the dose of mask 2 is, for example, 4:5, then the intensity values in the graphics file or data structure of the aerial image of mask 1 are multiplied by 4/5. The intensity values of the graphics file or data structure of the overall image is now normalized again, i.e., at a completely transparent location on both masks, for example a chromium-free location on a quartz/chromium mask, the intensity is assigned the maximum value of 255 (clear normalization), whereas at a completely opaque location on the masks, for example, completely chromium-coated locations on the quartz-chromium mask, the intensity is assigned the minimum value of 0.

Resist parameters 114 are provided to a resist simulator that simulates the development of the resist upon double exposure of the aerial images 116. The processes that take place during the development of the resist cause an increase in contrast, i.e., only exposed and unexposed areas can be distinguished from one another in a zero$^{th}$ approximation. A simple approximation for displaying these resist images is to set an intensity value (intensity threshold). For intensity values above the intensity threshold, the resist is assumed to be exposed, and for those under the threshold, unexposed. The exposed and unexposed areas are then displayed in two different colors. For example, the structures remaining as a chromium layer on the mask can be displayed in black, and the transparent areas in white. In displaying the overall structure, represented by the double exposure resist image 118, the intensity threshold can be specified and varied in order to adjust the critical dimension 120.

In a more precise method, the resulting structure is determined from the continuous intensity values by simulating the processes taking place in the resist and during its development.

In the simplified resist model used here, which is described more precisely in Patent Application DE102008019341, only two parameters are specified: the effective dose, as the product of the sensitivity C of the resist and the dose D, the diffusion length and the concentration of the base, which are combined into one parameter with the resist threshold. In displaying the overall structure, the intensity threshold can be specified and varied to adjust the critical dimension. The other parameters can be stored in a file for the overall structure or downloaded from a corresponding file. Other resist models can be used.

Double Patterning

Figure 4:
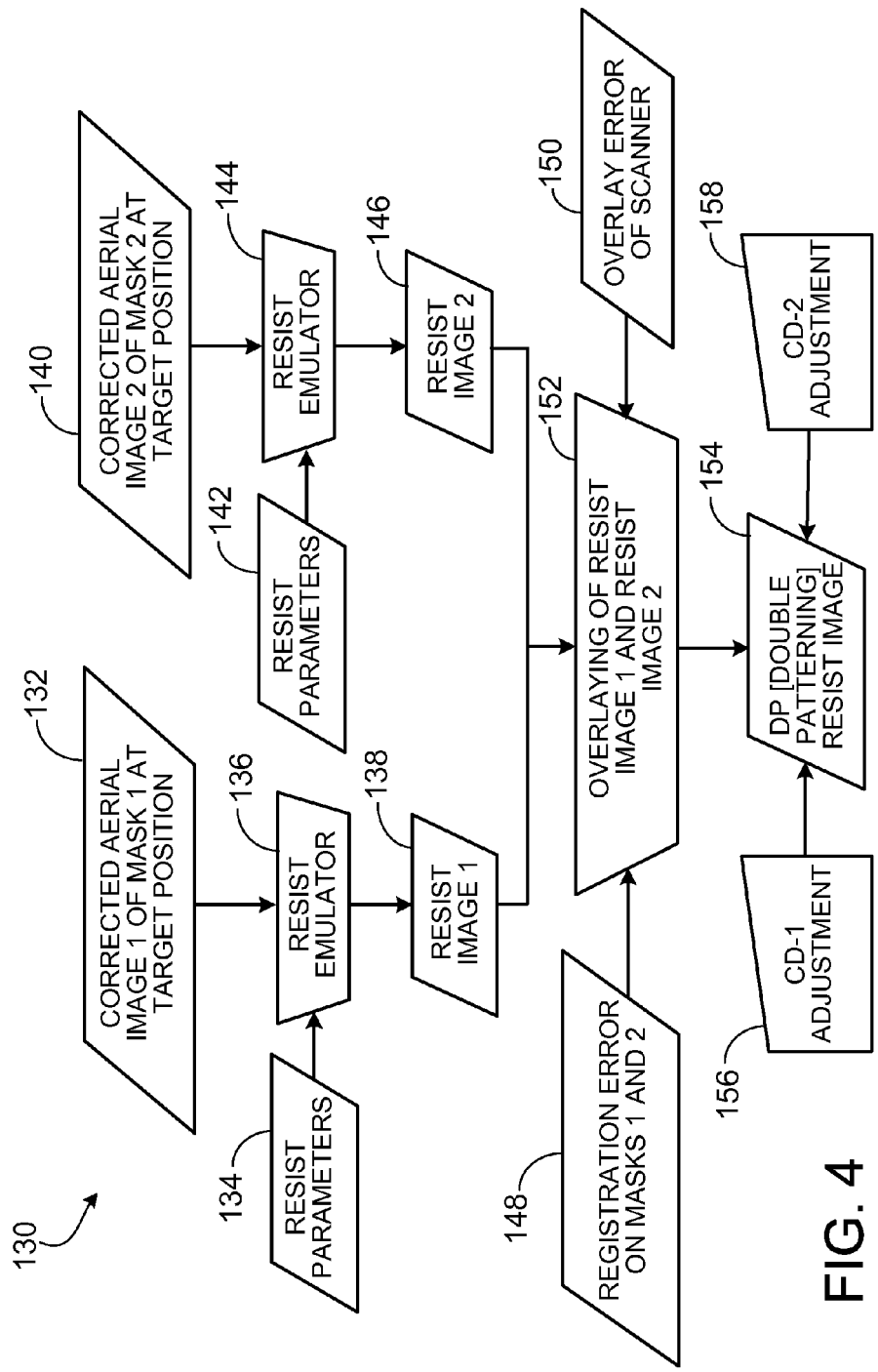
FIG. 4 is a diagram of an example process for emulating double patterning.

FIG. 4 is a diagram of an example process 130 for emulating double patterning. To emulate double patterning, a first corrected aerial image of a first mask at a target position is determined 132. Resist parameters 134 are provided to a resist emulator 136 to simulate a first resist image resulting from exposure to the first corrected aerial image 138. A second corrected aerial image of a second mask at a target position is determined 140. Resist parameters 142 are provided to a resist emulator 144 to simulate a second resist image resulting from exposure to the second corrected aerial image 146. The registration errors on the first and second masks are determined 148, and the overlay error of the scanner is determined 150. The first and second resist images are overlaid by adding the intensity values of the pixels of the first and second resist images 152, taking into account of the registration errors and the scanner error. The intensity threshold is applied to the two aerial images of the substructures. In displaying the overall structure, represented by the double patterning resist image 154, the intensity threshold can be specified and varied by using a respective slider for each of the substructures in order to adjust the critical dimension of the first mask 156 and adjust the critical dimension of the second mask 158.

The more elaborate method of resist simulation described above can also be used. In displaying the overall structure, the effective dose can be specified and varied to adjust the critical dimension. The other parameters can be stored in a file for each of the substructures or downloaded from a corresponding file. Only after this measure are the aerial images overlaid by adding up the intensity values of the individual pixels. Other resist models can be used.

The subsequent processing and display of the graphics files or data structures of the captured images take place in the processing unit 40, which can be, e.g., a personal computer that has a monitor as display equipment. The processing unit 40 is equipped with a graphic user interface that permits operation by using a pointing device, such as a computer mouse. To perform an overlay, the graphics files or data structures of the substructures and the graphics files or data structures of the associated simulated images are selected. The decision of whether to emulate double exposure or double patterning is then made using a selection menu.

Figure 5:
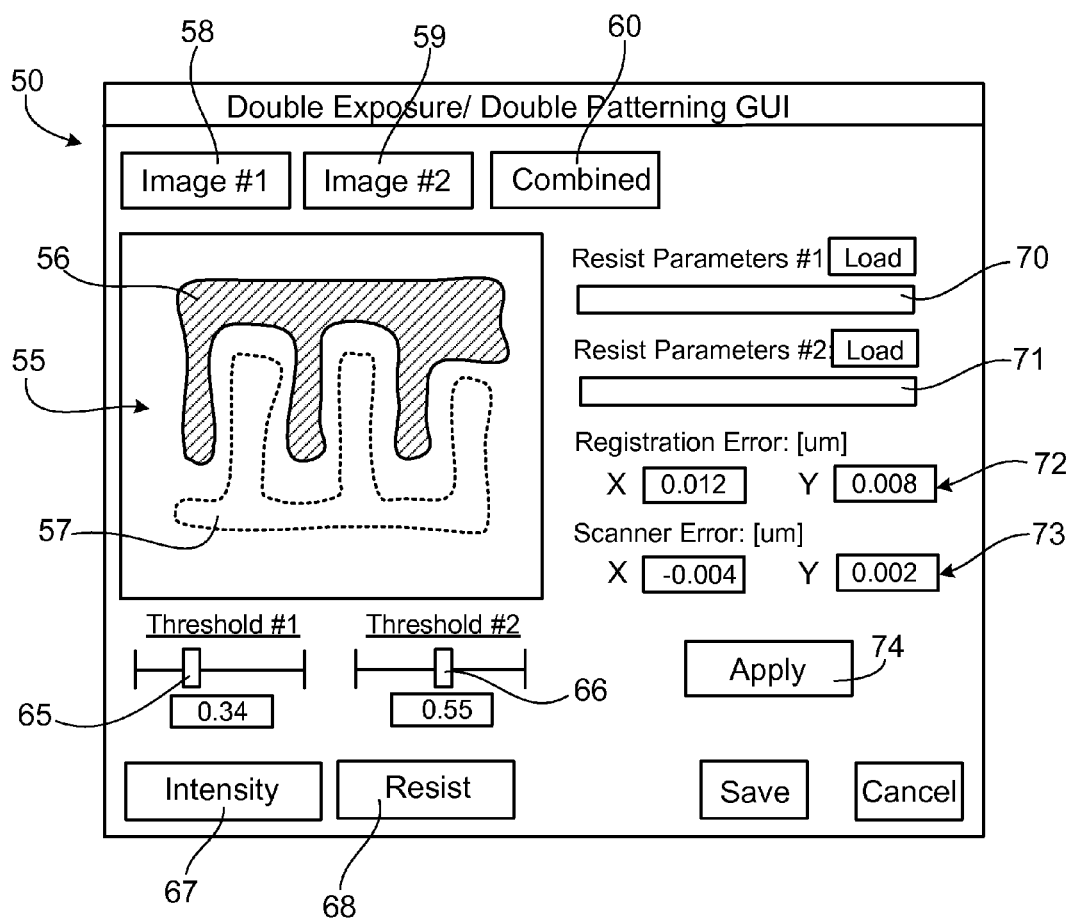
FIG. 5 is a diagram of an example graphical user interface for the parameterization and visualization of the emulated overall structure.

FIG. 5 is a diagram of an example double exposure/double patterning graphical user interface 50. The graphical user interface 50 is displayed on the monitor of the processing unit 40 by using a computer program executing in the processing unit 40. This is used to input parameters and display the resulting images. FIG. 5 shows an example of an overall structure 55 generated by the overlaying of two substructures 56 and 57. The display of one of the substructures can be activated using two buttons 58 and 59, and the overall structure can be displayed using button 60.

For double patterning, the following functions are available. If button 67 is selected, the intensity threshold for the display of substructures 56 and 57 can be adjusted using sliders 65 and 66. The display is updated immediately after the manipulation of slider 65 or 66. If button 68 is selected, a resist simulation is performed for both substructures 56 and 57. The resist parameters that are designated to be used can be downloaded from files and are displayed in fields 70 and 71. The effective dose for each substructure 56 and 57 is then adjusted using sliders 65 and 66. The display is again updated immediately after the manipulation.

In the case of double exposure, slider 65 changes the intensity threshold or, depending on the setting, the effective dose for the overall structure. The second slider 66 serves to adjust the ratio between the doses for exposure of the two substructures. If the slider is in the central starting position, the dose ratio is 1:1. If the slider is slid to the left, the proportion of the dose assigned to mask 1 increases; if the slider is slid to the right, the proportion of the dose assigned to mask 2 is increased. The resist parameters from field 70 are used to simulate the overall structure, and field 71 is deactivated. The registration error and the scanner error are input into the designated fields 72 and 73. When a button 74 is selected, input values relating to the resist and the registration and scanner errors are applied to the graphics files or data structures.

The overall structure so obtained can now be compared with an overall structure generated by simulation, to identify defects. It is also possible to run a comparison of identical structure slices of the overall structure for defect identification, a so-called "die to die" comparison.

It is advantageous if all the selected positions are measured on the first mask to begin with and then on the second mask. Alternatively, the aerial images of one of the masks are generated by simulation.

The generated aerial images of the two substructures are now overlaid, as described above, to emulate the double exposure or the double patterning.

The structural characteristics are then analyzed in the processing unit 40 by using predefined evaluation algorithms. This includes an analysis of, for example, the critical dimension. For example, other structural variables include the process window, i.e., the possible adjustment range for parameter selection within which the overall structure will be imaged correctly on the photoresist so that no defects arise. The maximum possible overlay error of a set of masks can be determined in this way. In analyzing different areas of the overall structure of a set of masks in which those areas have different types of structures, it is also possible to determine the largest common process window for the different areas, and thus the process window of the mask set as a whole.

In some implementations, the masks are measured only at the positions that present structures that may be critical in terms of adherence to specified tolerances when the overall structure is subsequently imaged on the photoresist. Aerial images can be captured at, for example, 100, 300, or up to 1000 positions per mask. Structures of this kind, which are termed "hot spots" or areas of interest (ROIs), are preselected on the mask, using known algorithms or by hand, on the basis of a mask design file containing the topography or the layout of the overall structure. For example, to establish a critical dimension map, periodic or regular structures are preferably selected.

To analyze critical areas of the mask design ("hot spots"), for example, software packages used for integrated circuit mask design are employed. This so-called "Electronic Design Automation" (EDA) program manages and generates the data needed for the production of an integrated circuit, such as, for example, the layout of the photomask (the mask design), the resulting aerial image, and the image in the resist after exposure. The entire process of integrated circuit fabrication, from exposure through the aerial image to the resist image and the structure in the silicon, can be simulated by the EDA program. The goal is, for example, through these simulations, to optimize the mask layout by so-called OPC corrections in such a way that a desired structure can be transferred from the mask into the resist or the silicon taking various process fluctuations into account. These programs provide functions that make it possible to identify, for example, critical areas (hot spots) in the mask layout.

Criteria for hot spots include, for example, whether areas present a small process window or react sensitively to process fluctuations. For example, the hot spots can be identified at the beginning, and in subsequent steps, the layout of the mask is optimized in the areas of the hot spots. Since this process is a simulation, it is advantageous to check the actual behavior of the hot spots metrologically after the mask has been fabricated. One example of an EDA program is the Calibre Workbench software package, available from Mentor Graphics, or Synopsis, available from Cadence. Calibre Workbench has a "Calibre Metrology Interface" (CMI), which generates an output file in XML format that contains, for example, information on the positions of hot spots. For example, this output file may contain the following information, as may be required:

All measurement conditions, such as, for example, the wavelength of the light source, the structural characteristics to be measured, such as critical dimension, normalized image log slope (NILS), depth of focus (DOF), exposure latitude (EL), LWR, and contact hole diameter.

The overlay error of the scanner and the registration error.

Information on the focus stack to be measured, i.e., the number and orientation of the planes to be measured. Here, for example, 5 or 7 equidistant planes within 80% of the DOF are selected, the middle plane being the best focus plane.

All positions on the mask and in the mask design at which aerial images are captured, giving the coordinates of the center of the image to be measured.

The positions, size and orientation (width, length, angle) and target values of the structural characteristics to be determined.

Assignment of the simulated aerial images to the aerial images to be captured and to the positions where the structural characteristics are to be measured on the mask. For each position where a structural characteristic is to be measured, the file name of the associated simulated image is given. A simulated aerial image can also contain a plurality of positions where structural characteristic are to be measured and can be assigned to them as appropriate.

Evaluation algorithms for evaluating the measured structural characteristics. Statistical functions can be implemented in this way. For example, if the critical dimension of a structural unit of lines and spaces is measured, it can be specified that the average of a plurality of measurements of the same target variable is to be determined. Nearly arbitrary structural characteristics can also be displayed interdependently and across all the focal planes. For example, the critical dimension across the location as a CDU map or Normalized Image Log Slope (NILS), Depth of Focus (DOF) as a function of Exposure Latitude (EL) or EL as a function of DOF. Another way to perform the evaluation is to display the overlay of the captured aerial image with the simulated aerial image of the same slice of a structure. Discrepancies between the aerial images are then displayed highlighted and in color.

In an automated process, these data (for example, as an XML file) can be routed along with the mask to the processing unit 40 of the mask inspection microscope 1 to control automated performance of the measurements.

The features described above related to processing of data, such as simulation of aerial images, comparison of simulated and captured aerial images, and correction of errors (e.g., aberrations or position errors), can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. A computer may include a processor for executing instructions and one or more memories for storing instructions and data. Generally, a computer will also include, or be operatively coupled to communicate with, one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

A number of implementations have been described. Nevertheless, it will be understood that various modifications may be made. For example, elements of one or more implementations may be combined, deleted, modified, or supplemented to form further implementations. As yet another example, the logic flows depicted in FIGS. 2-5 do not require the particular order shown, or sequential order, to achieve desirable results. In addition, other steps may be provided, or steps may be eliminated, from the described flows, and other components may be added to, or removed from, the described systems. For example, the processing unit 40 can be part of the microscope 1, or be a separate unit that is in communication with the microscope 1. The sizes and shapes of the masks and the substructures can be different from those described above. The errors in the aerial images that can be corrected by the processing unit 40 are not limited to those described above. Other embodiments are also within the scope of the following claims.

The invention claimed is:

1. A method for emulation of a photolithographic process for generating on a wafer an overall structure that is divided into at least two substructures, the two substructures on the wafer being produced based on two corresponding substructures on at least two masks, the method comprising:
generating aerial images of the at least two substructures on the at least two masks, the at least two substructures including at least a first substructure on a first one of the at least two masks and at least a second substructure on a second one of the at least two masks, and at least one of the aerial images being captured with a mask inspection microscope;
correcting, by using a processing unit, errors in the at least one aerial image captured with the mask inspection microscope, the errors including aberrations or distortions introduced into the at least one captured aerial image by the mask inspection microscope, in which correcting the errors includes modifying the at least one aerial image to reduce the aberrations or distortions; and
overlaying, using the processing unit, the aerial images of the at least two substructures to form an overall aerial image of the overall structure that includes the first and second substructures, in which prior to the overlaying, one of the aerial images has an image of the first substructure but not the second substructure, and another one of the aerial images has an image of the second substructure but not the first substructure, in which the overlaying the aerial images is performed after correcting errors in the at least one aerial image;
wherein a resist simulation is performed as an adjustment of the aerial images, and before the overlaying of the aerial images of the at least two substructures, the aerial images are adjusted to the ratio of the doses to be used for the masks in a scanner by multiplying all the intensity values of at least one of the aerial images by a factor.

2. The method of claim 1, comprising specifying a target position on at least one of the at least two masks for the capture of the at least one aerial image;
determining a deviation of the target position from an actual position by overlaying the captured aerial image with a simulated reference image; and
correcting the actual position so that the actual position matches the target position.

3. The method of claim 1, comprising adjusting at least one of the aerial images by simulating aberrations introduced by a scanner.

4. The method of claim 1 in which the at least two aerial images are adjusted to each other by displacement.

5. The method of claim 1 in which at least a portion of the displacement corresponds to a registration error resulting from the distortion of the substructures of the masks.

6. The method of claim 4 in which at least a portion of the displacement corresponds to an overlay error of a scanner.

7. The method of claim 1 in which a display of intensity values that are greater than an intensity threshold is carried out as an adjustment of the aerial images.

8. The method of claim 7 in which the intensity threshold can be varied in real time.

9. The method of claim 1 in which a resist simulation is performed as an adjustment of the overall aerial image.

10. The method of claim 1 in which an effective dose for resist simulation can be varied in real time.

11. The method of claim 1 in which at least one of the aerial images is generated by simulation from mask design data.

12. The method of claim 11 in which the simulation of the at least one aerial image or reference image is based on the same illumination settings of the mask inspection microscope as the capture of the images.

13. The method of claim 1 in which correcting errors in the at least one aerial image comprises modifying, by using the processing unit, the at least one aerial image to correct the errors, and the aerial images being overlaid to form the overall aerial image comprise the modified at least one aerial image.

14. The method of claim 1, comprising identifying coefficients that represent aberrations of the mask inspection microscope, and correcting the errors in the at least one aerial image based on the coefficients.

15. A system for emulating a photolithographic process for generating on a wafer an overall structure that is divided into at least two substructures, the two substructures on the wafer being produced based on two corresponding substructures on at least two masks, comprising:
a mask inspection microscope to capture at least one of aerial images of at least two substructures on at least two masks, the at least two substructures including at least a first substructure on a first one of the at least two masks and at least a second substructure on a second one of the at least two masks, the microscope comprising
a processing unit that is configured to
correct errors in the at least one aerial image captured with the mask inspection microscope, the errors including aberrations or distortions introduced into the at least one captured aerial image by the mask inspection microscope, in which correct the errors includes modify the at least one aerial image to reduce the aberrations or distortions, and
overlay the aerial images of the at least two substructures to form an overall aerial image of the overall structure that includes the first and second substructures, in which prior to the overlay, one of the aerial images has an image of the first substructure but not the second substructure, and another one of the aerial images has an image of the second substructure but not the first substructure, in which the overlaying the aerial images is performed after correcting errors in the at least one aerial image;
wherein a resist simulation is performed as an adjustment of the aerial images, and before the overlaying of the aerial images of the at least two substructures, the aerial images are adjusted to the ratio of the doses to be used for the masks in a scanner by multiplying all the intensity values of at least one of the aerial images by a factor.

16. The system of claim 15 in which the processing unit is configured to
specify a target position on at least one of the at least two masks for the capture of the at least one aerial image;
determine a deviation of the target position from an actual position by overlaying the captured aerial image with a simulated reference image; and
correct the actual position so that the actual position matches the target position.

17. The system of claim 15 in which the processing unit is configured to correct aberrations introduced into the at least one captured aerial image by the mask inspection microscope.

18. The system of claim 15 in which the processing unit is configured to adjust at least one of the aerial images by simulating aberrations introduced by a scanner.

19. The method of claim 15 in which the processing unit is configured to identify coefficients that represent aberrations of the mask inspection microscope, and correct the errors in the at least one aerial image based on the coefficients.

20. A non-transitory machine-readable storage medium storing instructions that when read by a machine causes a data processor to perform:
receiving aerial images of at least two substructures on at least two masks, the at least two substructures including at least a first substructure on a first one of the at least two masks and at least a second substructure on a second one of the at least two masks, and at least one of the aerial images being captured with a mask inspection microscope;
correcting errors in the at least one aerial image captured with the mask inspection microscope, the errors including aberrations or distortions introduced into the at least one captured aerial image by the mask inspection microscope, in which correcting the errors includes modifying the at least one aerial image to reduce the aberrations or distortions; and
overlaying the aerial images of the at least two substructures to form an overall aerial image of the overall structure that includes the first and second substructures, in which prior to the overlaying, one of the aerial images has an image of the first substructure but not the second substructure, and another one of the aerial images has an image of the second substructure but not the first substructure, in which the overlaying the aerial images is performed after correcting errors in the at least one aerial image;
wherein a resist simulation is performed as an adjustment of the aerial images, and before the overlaying of the aerial images of the at least two substructures, the aerial images are adjusted to the ratio of the doses to be used for the masks in a scanner by multiplying all the intensity values of at least one of the aerial images by a factor.

21. A method for emulation of a photolithographic process for generating on a wafer an overall structure that is divided into at least two substructures, the two substructures on the wafer being produced based on two corresponding substructures on at least two masks, the method comprising:

generating aerial images of the at least two substructures on the at least two masks, the at least two substructures including at least a first substructure on a first one of the at least two masks and at least a second substructure on a second one of the at least two masks, and at least one of the aerial images being captured with a mask inspection microscope;

modifying, by using a processing unit, at least one aerial image captured with the mask inspection microscope to correct errors in the at least one aerial image, the errors including aberrations or distortions introduced into the at least one captured aerial image by the mask inspection microscope, in which modifying the at least one aerial image includes reducing the aberrations or distortions in the at least one aerial image;

overlaying the aerial images of the at least two substructures to form a double exposure aerial image of the overall structure, in which the overlaying the aerial images is performed after modifying the at least one aerial image to reduce aberrations or distortions; and simulating a double exposure resist image using the double exposure aerial image of the overall structure and a resist model;

wherein a resist simulation is performed as an adjustment of the aerial images, and before the overlaying of the aerial images of the at least two substructures, the aerial images are adjusted to the ratio of the doses to be used for the masks in a scanner by multiplying all the intensity values of at least one of the aerial images by a factor.

22. The method of claim 21, comprising identifying coefficients that represent aberrations of the mask inspection microscope, and modifying the at least one aerial image based on the coefficients.

23. A method for emulation of a photolithographic process for generating on a wafer an overall structure that is divided into at least two substructures, the two substructures on the wafer being produced based on two corresponding substructures on at least two masks, the method comprising:

generating aerial images of the at least two substructures on the at least two masks, the at least two substructures including at least a first substructure on a first one of the at least two masks and at least a second substructure on a second one of the at least two masks, and at least one of the aerial images being captured with a mask inspection microscope;

modifying, by using a processing unit, at least one aerial image captured with the mask inspection microscope to correct errors in the at least one aerial image, the errors including aberrations or distortions introduced into the at least one captured aerial image by the mask inspection microscope, in which modifying the at least one aerial image includes reducing the aberrations or distortions in the at least one aerial image;

simulating a first resist image based on a first one of the aerial images and a resist model, in which the simulating the first resist image is performed after modifying the at least one aerial image to reduce aberrations or distortions;

simulating a second resist image based on a second one of the aerial images and the resist model; and overlaying the first and second resist images to form a double patterning resist image;

wherein a resist simulation is performed as an adjustment of the aerial images, and before the overlaying of the aerial images of the at least two substructures, the aerial images are adjusted to the ratio of the doses to be used for the masks in a scanner by multiplying all the intensity values of at least one of the aerial images by a factor.

24. The method of claim 23, comprising identifying coefficients that represent aberrations of the mask inspection microscope, and modifying the at least one aerial image based on the coefficients.

25. A method for emulation of a photolithographic process for generating on a wafer an overall structure that is divided into at least two substructures, the two substructures on the wafer being produced based on two corresponding substructures on at least two masks, the method comprising:

generating aerial images of the at least two substructures on the at least two masks, the at least two substructures including at least a first substructure on a first one of the at least two masks and at least a second substructure on a second one of the at least two masks, and at least one of the aerial images being captured with a mask inspection microscope;

correcting, by using a processing unit, errors in the at least one aerial image captured with the mask inspection microscope, the errors including aberrations or distortions introduced into the at least one captured aerial image by the mask inspection microscope, in which correcting the errors includes modifying the at least one aerial image to reduce the aberrations or distortions; and adjusting the aerial images to the ratio of the doses to be used for the masks in a scanner by multiplying all the intensity values of at least one of the aerial images by a factor; and overlaying, using the processing unit, the aerial images of the at least two substructures to form an overall aerial image of the overall structure, in which the intensity values of at least one of the aerial images has been adjusted according to the ratio of the doses to be used for the masks in the scanner, in which the overlaying the aerial images is performed after correcting errors in the at least one aerial image;

wherein a resist simulation is performed as an adjustment of the aerial images.

26. The method of claim 25, comprising identifying coefficients that represent aberrations of the mask inspection microscope, and correcting the errors in the at least one aerial image based on the coefficients.

27. A method for emulation of a photolithographic process for generating on a wafer an overall structure that is divided into at least two substructures, the at least two substructures on the wafer being produced based on at least two corresponding substructures on at least two masks, the method comprising:

capturing a first aerial image of a first substructure on a first mask with a mask inspection microscope;

generating a second aerial image of a second substructure on a second mask by simulation from mask design data, in which the illumination setting for simulating the second aerial image from mask design data is the same as the illumination setting for capturing the first aerial image with the mask inspection microscope;

correcting, by using a processing unit, errors in the first aerial image captured with the mask inspection microscope, the errors including aberrations or distortions introduced into the at least one captured aerial image by the mask inspection microscope, in which correcting the errors includes modifying the at least one aerial image to reduce the aberrations or distortions; and overlaying, using the processing unit, the first and second aerial image of the first and second substructures to form an overall aerial image, in which the overlaying the aerial images is performed after correcting errors in the at least one aerial image;

wherein a resist simulation is performed as an adjustment of the aerial images, and before the overlaying of the aerial images of the at least two substructures, the aerial images are adjusted to the ratio of the doses to be used for the masks in a scanner by multiplying all the intensity values of at least one of the aerial images by a factor.

28. The method of claim 27, comprising identifying coefficients that represent aberrations of the mask inspection microscope, and correcting the errors in the at least one aerial image based on the coefficients.

29. A method for emulation of a photolithographic process for generating on a wafer an overall structure that is divided into at least two substructures, the two substructures on the wafer being produced based on two corresponding substructures on at least two masks, the method comprising:

generating aerial images of the at least two substructures on the at least two masks, the at least two substructures including at least a first substructure on a first one of the at least two masks and at least a second substructure on a second one of the at least two masks, and at least one of the aerial images being captured with a mask inspection microscope;

correcting, by using a processing unit, errors in the at least one aerial image captured with the mask inspection microscope; and overlaying the aerial images of the at least two substructures to form an overall aerial image of the overall structure;

wherein a resist simulation is performed as an adjustment of the aerial images, at least one of the aerial images is generated by simulation from mask design data, and the simulation of the at least one aerial image or reference image is based on the same illumination settings of the mask inspection microscope as the capture of the images.

30. The method of claim 29, comprising specifying a target position on at least one of the at least two masks for the capture of the at least one aerial image;

determining a deviation of the target position from an actual position by overlaying the captured aerial image with a simulated reference image; and correcting the actual position so that the actual position matches the target position.

31. The method of claim 29, comprising correcting aberrations introduced into the at least one captured aerial image by the mask inspection microscope.

32. The method of claim 29, comprising adjusting at least one of the aerial images by simulating aberrations introduced by a scanner.

33. The method of claim 29 in which the at least two aerial images are adjusted to each other by displacement.

34. The method of claim 29 in which at least a portion of the displacement corresponds to a registration error resulting from the distortion of the substructures of the masks.

35. The method of claim 34 in which at least a portion of the displacement corresponds to an overlay error of a scanner.

36. The method of claim 29 in which a display of intensity values that are greater than an intensity threshold is carried out as an adjustment of the aerial images.

37. The method of claim 29 in which a resist simulation is performed as an adjustment of the overall aerial image.

38. The method of claim 37 in which the intensity threshold is varied in real time.

39. The method of claim 38 in which an effective dose for resist simulation is varied in real time.

40. The method of claim 29 in which before the overlaying of the aerial images of the at least two substructures, the aerial images are adjusted to the ratio of the doses to be used for the masks in a scanner by multiplying all the intensity values of at least one of the aerial images by a factor.

41. A system for emulating a photolithographic process for generating on a wafer an overall structure that is divided into at least two substructures, the two substructures on the wafer being produced based on two corresponding substructures on at least two masks, comprising:

a mask inspection microscope to capture at least one of aerial images of at least two substructures on at least two masks, the at least two substructures including at least a first substructure on a first one of the at least two masks and at least a second substructure on a second one of the at least two masks, the microscope comprising a processing unit that is configured to correct errors in the at least one aerial image captured with the mask inspection microscope, and overlay the aerial images of the at least two substructures to form an overall aerial image of the overall structure;

wherein a resist simulation is performed as an adjustment of the aerial images, at least one of the aerial images is generated by simulation from mask design data, and the simulation of the at least one aerial image or reference image is based on the same illumination settings of the mask inspection microscope as the capture of the images.

42. The system of claim 41 in which the processing unit is configured to specify a target position on at least one of the at least two masks for the capture of the at least one aerial image; determine a deviation of the target position from an actual position by overlaying the captured aerial image with a simulated reference image; and correct the actual position so that the actual position matches the target position.

43. The system of claim 41 in which the processing unit is configured to correct aberrations introduced into the at least one captured aerial image by the mask inspection microscope.

44. The system of claim 41 in which the processing unit is configured to adjust at least one of the aerial images by simulating aberrations introduced by a scanner.

45. The system of claim 41 in which the processing unit is configured to adjust the at least two aerial images relative to each other by displacement.

46. The system of claim 41 in which a resist simulation is performed as an adjustment of the overall aerial image.

47. The system of claim 41 in which the processing unit is configured to, before the overlay of the aerial images of the at least two substructures, adjust the aerial images to the ratio of the doses to be used for the masks in a scanner by multiplying all the intensity values of at least one of the aerial images by a factor.

48. A non-transitory machine-readable storage medium storing instructions that when read by a machine causes a data processor to perform:

receiving aerial images of at least two substructures on at least two masks, the at least two substructures including at least a first substructure on a first one of the at least two masks and at least a second substructure on a second one of the at least two masks, and at least one of the aerial images being captured with a mask inspection microscope;

correcting errors in the at least one aerial image captured with the mask inspection microscope; and overlaying the aerial images of the at least two substructures to form an overall aerial image of the overall structure;

wherein a resist simulation is performed as an adjustment of the aerial images, at least one of the aerial images is generated by simulation from mask design data, and the simulation of the at least one aerial image or reference image is based on the same illumination settings of the mask inspection microscope as the capture of the images.

49. The non-transitory machine-readable storage medium of claim 48 in which the storage medium stores instructions that causes the data processor to correct aberrations introduced into the at least one captured aerial image by the mask inspection microscope.

50. The non-transitory machine-readable storage medium of claim 48 in which the storage medium stores instructions that causes the data processor to adjust at least one of the aerial images by simulating aberrations introduced by a scanner.

51. The non-transitory machine-readable storage medium of claim 48 in which the storage medium stores instructions that causes the data processor to adjust the at least two aerial images relative to each other by displacement.

52. The non-transitory machine-readable storage medium of claim 48 in which at least a portion of the displacement corresponds to a registration error resulting from the distortion of the substructures of the masks.

53. The non-transitory machine-readable storage medium of claim 52 in which at least a portion of the displacement corresponds to an overlay error of a scanner.

54. The non-transitory machine-readable storage medium of claim 48 in which the storage medium stores instructions that causes the data processor to perform a resist simulation as an adjustment of the overall aerial image.

55. The non-transitory machine-readable storage medium of claim 48 in which the storage medium stores instructions that causes the data processor to, before the overlaying of the aerial images of the at least two substructures, adjust the aerial images to the ratio of the doses to be used for the masks in a scanner by multiplying all the intensity values of at least one of the aerial images by a factor.

* * * * *

UNITED STATES PATENT AND TRADEMARK OFFICE
CERTIFICATE OF CORRECTION

PATENT NO. : 8,913,120 B2  
APPLICATION NO. : 12/862057  
DATED : December 16, 2014  
INVENTOR(S) : Eric Poortinga et al.

Page 1 of 1

It is certified that error appears in the above-identified patent and that said Letters Patent is hereby corrected as shown below:

ON THE TITLE PAGE

Page 1

Column 1, item (30), (Foreign Application Priority Data), delete "10 2009 038 588" and insert -- 10 2009 038 558 --

IN THE CLAIMS

Column 13

Line 59, in Claim 15, delete "correct" and insert -- correcting --

Column 14

Line 28, in Claim 19, delete "method" and insert -- system --

Signed and Sealed this
Twenty-first Day of April, 2015

Michelle K. Lee
*Director of the United States Patent and Trademark Office*